ION BOMBARDMENT OF INSULATED GATE SEMICONDUCTOR DEVICES

Filed Aug. 2, 1967 2 Sheets-Sheet 1

INVENTORS
TERRY G. ATHANAS &
DAVID M. GRISWOLD

BY [signature]
ATTORNEY

ION BOMBARDMENT OF INSULATED GATE SEMICONDUCTOR DEVICES

Filed Aug. 2, 1967 2 Sheets-Sheet 2

INVENTORS,
TERRY G. ATHANAS &
DAVID M. GRISWOLD

BY [signature]
ATTORNEY

United States Patent Office 3,540,925
Patented Nov. 17, 1970

3,540,925
ION BOMBARDMENT OF INSULATED GATE SEMICONDUCTOR DEVICES

Terry G. Athanas, Lebanon, and David M. Griswold, New Providence, N.J., assignors to RCA Corporation, a corporation of Delaware Filed Aug. 2, 1967, Ser. No. 657,930
Int. Cl. B44d 1/18
U.S. Cl. 117—217 5 Claims

ABSTRACT OF THE DISCLOSURE

A process for manufacturing an insulated gate field effect transistor in which the dielectric layer underlying the gate electrode is subjected to ion bombardment prior to deposition of the gate electrode on the dielectric layer. The purpose of the ion bombardment process is to modify the mutual conductance, low frequency noise, and temperature coefficient characteristics of the transistor. The ion bombardment is accomplished by (i) placing the partially completed device in an argon atmosphere at low pressure, (ii) applying a high voltage between electrodes exposed to the argon gas to ionize the gas and initiate a glow discharge, and (iii) leaving the device in the glow discharge region for a predetermined time so that ions from the discharge region bombard the dielectric layer.

BACKGROUND OF THE INVENTION

This invention relates to a process for manufacturing insulated gate semiconductor devices and, more particularly, to a process using ion bombardment to modify the electrical characteristics of such devices.

In the manufacture of insulated gate semiconductor devices such as, for example, metal-oxide-semiconductor field effect transistors, difficulties arise due to spurious conditions at the interface between the semiconductor surface and the adjacent dielectric layer, especially that portion of the dielectric layer which is situated between the semiconductor surface and the overlying gate electrode. The dielectric layer is generally deposited in a manner which results in the layer composition deviating somewhat from ideal stoichiometric proportions. In addition, it is believed that ionic impurity contaminants become trapped in the deposited dielectric layer. These and possibly other effects not well understood at the present time, result in the formation of electron trapping sites in the portion of the dielectric layer adjacent the semiconductor surface.

Insulated gate field effect transistors presently manufactured have been observed to exhibit the formation of a layer of positive charge in the dielectric layer adjacent the semiconductor surface. This layer of positive charge tends to trap electrons moving between the spaced source and drain regions of the transistor, thus decreasing the effective mobility of the device. The positive charge layer subjects the underlying channel region to an electric field which increases the channel conductivity (for N-channel devices), so that (for enhancement-type devices) substantial conduction between the source and drain regions is observed after the gate electrode voltage has been reduced to zero. The observed layer of positive charge at the interface between the dielectric layer and the semiconductor surface also modifies the temperature coefficient of the device.

It is therefore evident that by reducing the traps in the oxide layer adjoining the semiconductor surface, an improvement in effective mobility (and therefore in mutual conductance) of the insulated gate semiconductor device can be achieved. A surface stabilizing technique employed according to the prior art is the use of a composite dielectric layer comprising silicon dioxide and an overlying film of phosphosilicate glass. While the beneficial results obtained by the use of the phosphosilicate glass for stabilizing the silicon dioxide surface are not completely understood, it is believed that the phosphorous serves to eliminate some of the traps in the silicon dioxide layer due to oxygen ion deficiencies. This phosphosilicate glass stabilizing technique is discussed in an article by D. R. Kerr et al. entitled "Stabilization of $SiO_2$ Passivation Layers with $P_2O_5$," reported in the IBM Journal of Research and Development, volume 8 (1964), at page 376.

An object of our invention is to provide an improved process for manufacturing insulated gate semiconductor devices having improved or modified electrical characteristics.

Another object is to provide such a process which is compatible with the phosphosilicate glass stabilization technique.

SUMMARY

According to the invention, there is provided an improved process for manufacturing an insulated gate semiconductor device in which, at an intermediate stage of manufacture, the insulating (dielectric) layer which underlies the gate electrode is bombarded with ions in order to modify the electrical characteristics of the resultant device. The ion bombardment is preferably accomplished by subjecting the device to an atmosphere containing an ionizable gas and applying a voltage between spaced electrodes exposed to the gas, the voltage being sufficiently high to ionize the gas so that gas ions bombard the surface of the insulating layer.

Figure 3:
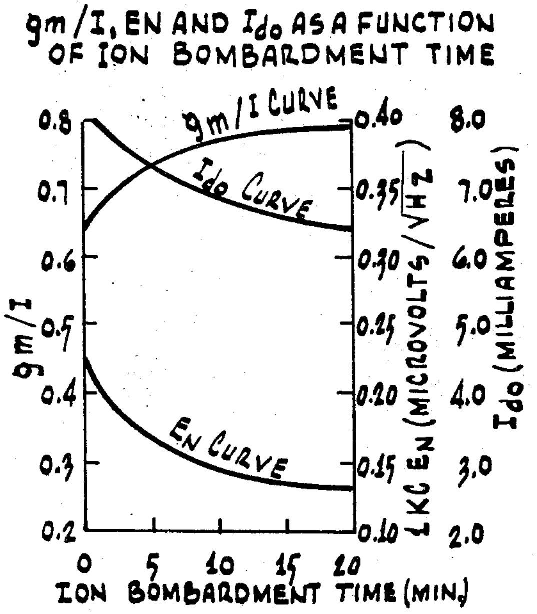
Figure 5:
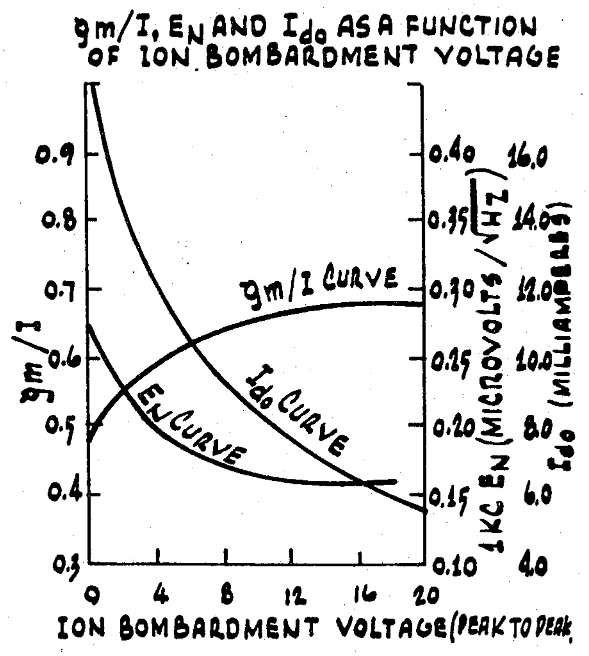
Figure 4:
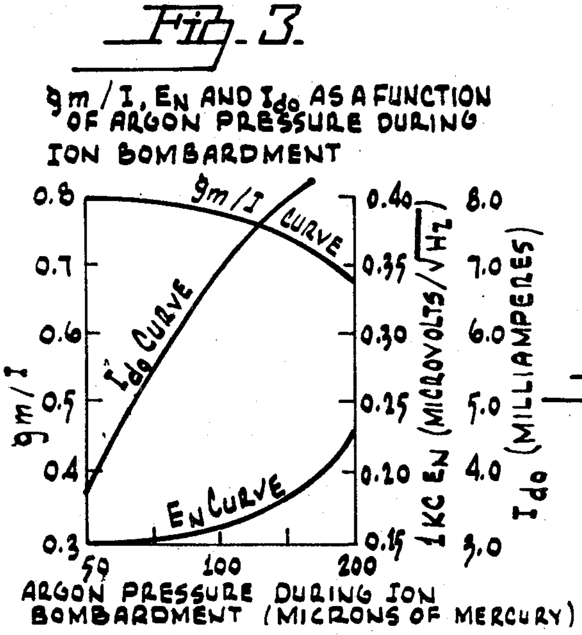
Figure 6:
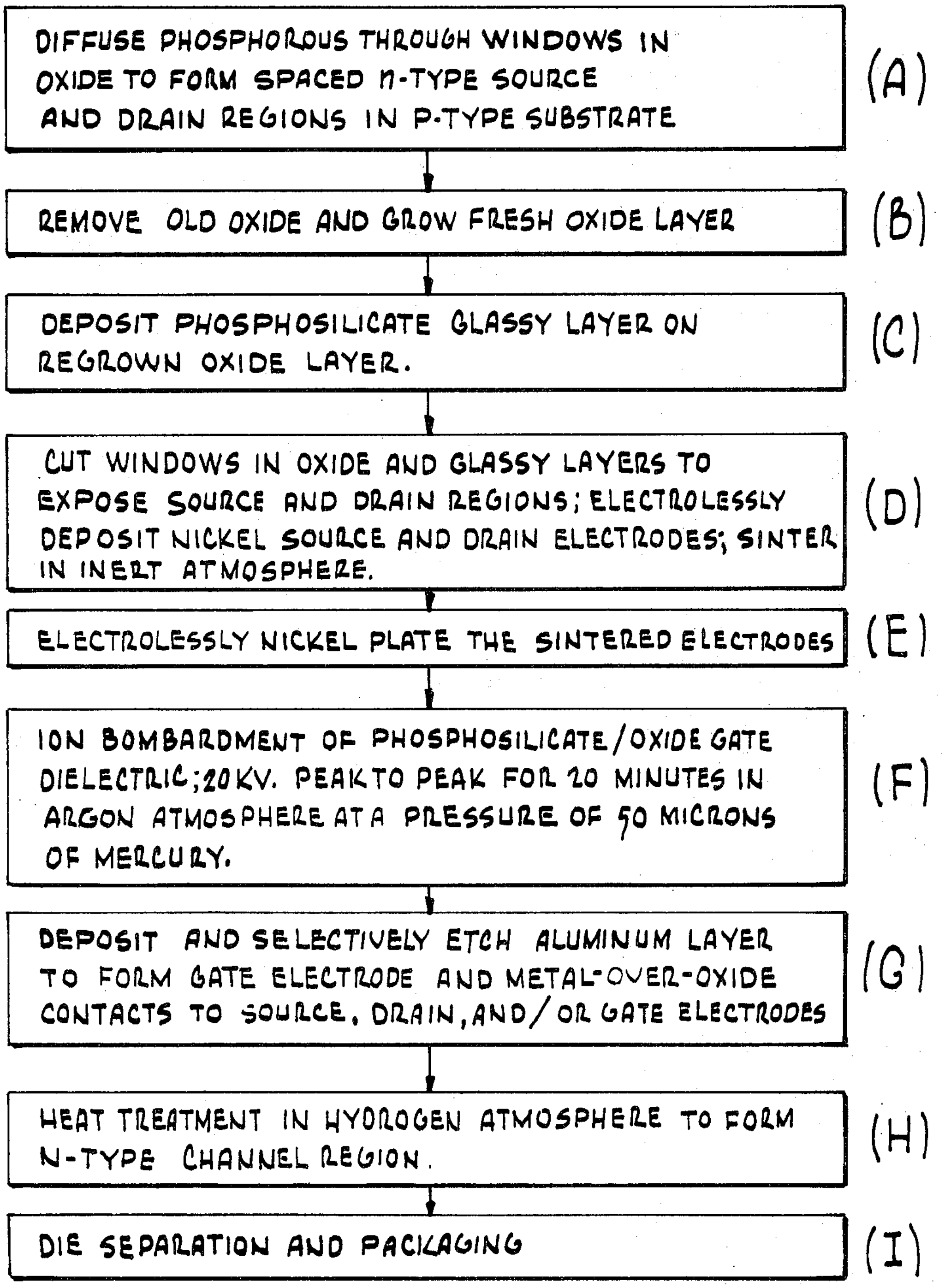

FIGS. 3, 4, and 5 show graphs of results obtained by the ion bombardment process of the invention; and FIG. 6 shows a flow diagram for a preferred embodiment of the process according to the invention.

DETAILED DESCRIPTION

Figure 1:
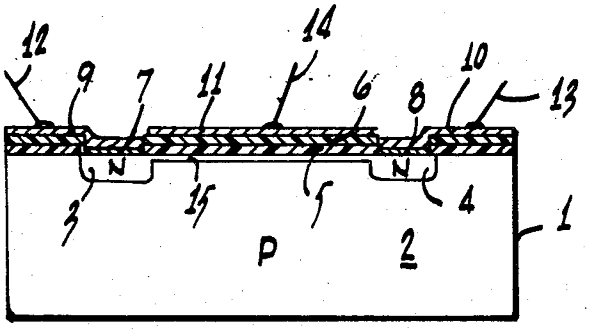
FIG. 1 shows an insulated gate semiconductor device manufactured according to the invention.

FIG. 1 shows an N-channel depletion type insulated gate field effect transistor which has been manufactured according to a preferred embodiment of our process. The transistor 1 comprises a body 2 of P type monocrystalline silicon semiconductor material into which there is inset from the upper surface of the body, two spaced N type regions 3 and 4, respectively. For convenience, the region 3 will be hereafter referred to as the source region and the region 4 as the drain region.

Disposed on the upper surface of the semiconductor body is a dielectric insulating layer 5 comprising thermally grown silicon dioxide. Disposed on the silicon dioxide layer 5 is an additional dielectric insulating layer 6 comprising a phosphosilicate glass of the typical composition $P_2O_5 \cdot SiO_2$. Windows in the dielectric laminate consisting of adjacent layers 5 and 6 expose corresponding portions of the source and drain regions 3 and 4. Nickel electrodes 7 and 8 are disposed on and sintered to the exposed respective source and drain region surfaces. A deposited aluminum layer 9 overlies a portion of the insulating layers and extends to the nickel electrode 7 to provide a relatively large area contact to the source region 3. Similarly, an aluminum layer 10 overlies a portion of the dielectric laminate (adjacent layers 5 and 6) and extends to the nickel electrode 8 to provide a relatively large area contact to the drain region 4. Overlying the portion of the dielectric laminate extending between the source and drain regions, is a deposited aluminum gate electrode 11. Terminal leads 12, 13, and 14 provide external electrical connections for the source, drain, and gate electrodes. An N type channel region 15 provides an ohmic path between source electrode 7 and drain electrode 8.

In operation, a negative voltage (with respect to the semiconductor body 2) applied to the gate electrode 11 decreases the conductivity of the adjacent portion of the N type channel region 15 thereby tending to reduce any current flowing between the spaced source and drain regions 3 and 4. By varying the (negative) potential applied to gate electrode 11 by means of terminal lead 14, the external current flowing between terminal leads 12 and 13 can be controlled. Similarly, application of a positive potential to the gate electrode 11 will increase the conductivity of the N type channel region 15, thereby tending to increase any current flowing between the source and drain electrodes.

FIG. 6 shows a flow diagram for the major process steps employed in fabricating the insulated gate field effect transistor of FIG. 1.

The first step (A) is the formation of the source and drain regions 3 and 4. These regions are formed by (i) thermally growing a silicon dioxide layer on the upper surface of the semiconductor body 2, (ii) cutting windows in the oxide layer by conventional photoetching methods to expose surface areas of the silicon body in registration with the desired source and drain regions, (iii) depositing a film of phosphosilicate glass on the exposed silicon surface by reacting it with phosphorus oxychloride ($POCl_3$) and oxygen at a temperature on the order of 1100° C., and (iv) maintaining the semiconductor body at the 1100° C. temperature for a time on the order of 15 minutes so that phosphorous diffuses into the body 2 from the phosphosilicate glass. The P type body 2 has a resistivity of 18–22 ohm-cm. and contains boron as the acceptor impurity material.

After formation of the source and drain regions, the oxide film is removed from the entire upper surface of the semiconductor body, and a fresh layer of silicon dioxide is thermally grown on the upper surface. The fresh layer of silicon dioxide is formed by heating the semiconductor body at a temperature of 950° C. in an atmosphere which comprises steam, for 8 minutes, followed by dry oxygen for 30 minutes, to form a silicon dioxide layer 5 having a thickness on the order of 600 angstroms. This corresponds to process step (B) in FIG. 6.

The next step (C) is the deposition of a phosphosilicate glass layer 6 on the thermally grown silicon dioxide layer 5. The phosphosilicate layer 6 is deposited by the vapor phase reaction of tetraethylorthosilicate and trimethyl phosphate (carried by an inert gas such as argon) for a period of time on the order of 5 minutes at a temperature on the order of 720° C. The resultant phosphosilicate glass layer 6 has a thickness on the order of 900 angstroms, resulting in an overall dielectric laminate thickness of approximately 1500 angstroms.

The next step (D) comprises the fabrication of ohmic contacts on the source and drain regions 3 and 4. First, windows are photoetched in the dielectric laminate comprising contiguous layers 5 and 6, to expose corresponding surfaces of the source and drain regions 3 and 4. Thin layers of nickel are electrolessly plated onto the exposed source and drain areas and sintered to each of these areas (in order to provide a good electrical connection) by heating the device in a nitrogen atmosphere at approximately 540° C. for a time on the order of 10 minutes. After sintering, an additional layer of nickel is electrolessly plated on each of the sintered layers (step E).

Figure 2:
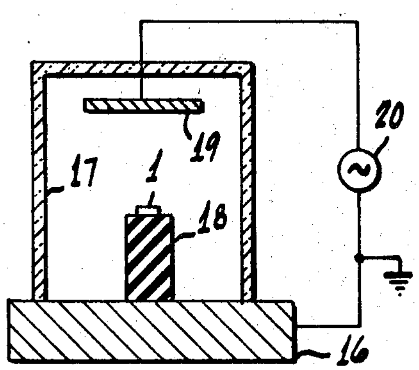
FIG. 2 shows apparatus used for practicing the ion bombardment process of the invention.

The next process step (F) is the ion bombardment of the dielectric laminate comprising adjacent layers 5 and 6, according to our invention. The apparatus used for performing this ion bombardment step is shown in FIG. 2 and includes a metallic base plate 16 and a glass cover 17 which is sealed to the base plate 16 in an airtight manner. Situated in the chamber formed between glass cover 17 and base plate 16 is an insulating support 18 secured to the base plate and a metallic electrode 19 spaced from the support. Situated on the insulating support 18 is the (partially completed) insulated gate field effect transistor 1 to be processed. The atmosphere inside the chamber is argon gas, maintained at a low pressure (on the order of 50 microns of mercury in our preferred embodiment of the invention).

Connected between the electrode 19 and the (grounded) base plate 16 is a source of high voltage 20. The source 20 should have a voltage between its terminals sufficient to ionize the argon gas within the chamber. According to our preferred embodiment, the source 20 has a peak-to-peak voltage on the order of 20 kilovolts.

Upon activating the apparatus of FIG. 2, there is produced a gaseous discharge between the base plate 16 and the spaced electrode 19; the electric field associated with the discharge causes atoms of the argon gas to be ionized and the ions (at times when the potential of the electrode 19 is positive with respect to ground) to bombard the upper surface of the transistor 1.

Although the voltage source 16 is shown as being an alternating voltage generator in FIG. 2, a unidirectional (DC) voltage source may be utilized if the source is poled so that the auxiliary electrode 19 is positive with respect to ground. This would produce a somewhat greater intensity of ion bombardment of the transistor 1 for comparable values of applied voltage.

With the aforementioned parameters -(argon atmosphere at a pressure of 50 microns of mercury and applied alternating voltage of 20 kilovolts peak-to-peak), the ion bombardment is preferably continued for a time on the order of 20 minutes, at which time the voltage source 20 is shut down and the transistor 1 removed for further processing.

A layer of aluminum (step G) is next deposited on the upper surface of the semiconductor body and photoetched to provide the gate electrode 11 and expanded metal-over-oxide contacts 9 (to the source electrode) and 10 (to the drain electrode) respectively.

The transistor is now heat treated (step H) in a hydrogen atmosphere at a temperature of approximately 340° C. for a period on the order of 5 minutes. This treatment (i) inverts the conductivity type of a thin layer of semiconductor material adjacent the semiuonductor surface to form the N type channel region 15, and (ii) affects the temperature coefficient of the resultant device.

After heat treatment, the device is mounted in a suitable package (step I). External terminal leads 12, 13, and 14 for the source, drain, and gate connections respectively may then be provided by thermo-compression or ultrasonic bonding to the corresponding aluminum layers of the transistor 1.

For the purpose of evaluating the magnitude of the improvement realized by the aforementioned ion bombardment process, reference is made to FIGS. 3–5. For obtaining the data displayed in each figure, an identical test wafer was used. Each of the three wafers contained four groups of devices, each device being similar to that shown in FIG. 1. One group on each test wafer was not subjected to ion bombardment. Each of the other groups on the wafer was subjected to a different set of ion bombardment conditions.

Table I shows the conditions used for ion bombardment of the three processed groups (the fourth group of each wafer served as the reference or control for comparison purposes) of the first wafer in which the gas pressure and applied voltage were maintained constant while the bombardment time was varied.

TABLE I

| Ion bombardment time | Argon pressure for ion bombardment | Ion bombardment voltage (peak-to-beak) |
|---|---|---|
| 5 minutes | 50 microns Hg | 20 kilovolts. |
| 10 minutes | do | Do. |
| 20 minutes | do | Do. |

Similarly, Table II shows the conditions used for processing of three groups from thesecond wafer, in which only the gas pressure was varied.

TABLE II

| Ion bombardment time | Argon pressure for ion bombardment | Ion bombardment voltage (peak-to-peak) |
|---|---|---|
| 10 minutes | 200 microns Hg | 20 kilovolts. |
| Do | 100 microns Hg | Do. |
| Do | 50 microns Hg | Do. |

In similar fashion, Table III shows the conditions used for processing transistors from the third wafer in which only the ion bombardment voltage was varied.

TABLE III

| Ion bombardment time | Argon pressure for ion bombardment | Ion bombardment voltage (peak-to-peak) |
|---|---|---|
| 10 minutes | 50 microns Hg | 6 kilovolts. |
| Do | do | 12 kilovolts. |
| Do | do | 20 kilovolts. |

After ion bombardment under the aforementioned conditions, each bombarded transistor (as well as the "control" units which were not bombarded) was electrically tested to determine the following characteristics:

(a) Normalized mutual conductance, defined as $$\frac{g_m}{I_d}\ \frac{\left(\frac{\delta I_d}{\delta V_g}\right)V_d=\text{constant}}{Id}$$

where:

$I_d$=drain current, i.e. current flowing through terminal lead 13

$V_d$=drain voltage, i.e. voltage between terminal leads 13 and 12

$V_g$=gate voltage, i.e. voltage between terminal leads 14 and 12;

(b) Drain current at zero gate voltage, defined as $$I_{do}=I_d|V_g=o$$

and (c) Low frequency noise $E_N$, defined as the R.M.S. value of the random voltage per square root of unit bandwidth at a specified frequency developed across a fixed resistance inserted in series with the drain terminal lead 13.

The specific parameters employed during each of the aforementioned electrical tests are set forth in Table IV below.

TABLE IV

| | Test | | |
|---|---|---|---|
| Parameter | Normalized mutual conductance | Drain current at zero gate voltage | Low frequency noise |
| $V_d$ | 12 volts | 12 volts | 12 volts. |
| $I_d$ | 4 milliamperes | | 3 milliamperes. |
| Frequency | 1,000 Hz | DC | 1,000 Hz. |

FIG. 3 is a plot of the electrical test data for the transistors of the first wafer, and shows the measured characteristics as a function of ion bombardment time.

Similarly, FIG. 4 corresponds to the second wafer, and shows the measured characteristics as a function of gas pressure.

In similar manner, FIG. 5 corresponds to the third wafer, and shows the measured characteristics as a function of ion bombardment voltage.

The data plotted in FIGS. 3–5 represents readings based on the average value measured for the devices of each test group.

Examinations of FIGS. 3–5 makes it quite clear that the most desirable conditions for high mutual conductance, low noise and low drain current (for zero gate voltage) are (i) long ion bombardment time, (ii) low gas pressure, and (iii) high ion bombardment voltage. The parameters we prefer are (i) an ion bombardment time on the order of 20 minutes, (ii) a gas pressure on the order of 50 microns of mercury, and (iii) an ion bombardment voltage on the order of 20 kilovolts peak-to-peak.

While argon was employed as the gas for the preferred embodiment of our process, other inert gases selected from Group O of the Periodic Table may also be employed. In addition to the use of our ion bombardment process for the modification of mutual conductance, drain current at zero gate voltage, and low frequency noise, the process may also be employed to control the temperature coefficient of gate voltage of the resultant devices, this coefficient being defined as $$\gamma T=\frac{\partial V_g}{\partial T}\Big|I_d=\text{constant}$$

where T is the temperature.

Devices subjected to ion bombardment which had a positive coefficient initially were observed to have a near zero temperature coefficient after bombardment for a time on the order of 10 minutes, but all devices tested were observed to exhibit a negative temperature coefficient after bombardment under the aforementioned conditions of pressure and voltage for a time on the order of 20 minutes. It is therefore evident that the bombardment process of our invention may be employed to control the temperature coefficient of the resultant devices, and even to tailor the coefficient to a predetermined desired value by terminating the ion bombardment at a time corresponding to the desired temperature coefficient.

While the explanation for the improved results achieved by our novel process is not completely understood at the present time, it is believed that the bombarding ions in some manner serve to reduce the number of surface traps in the silicon dioxide layer 5 adjacent the semiconductor surface. This reduces the number of electrons absorbed by traps, thus increasing the effective mobility of the channel region.

Similarly, low frequency noise is believed to be due to fluctuation in the number of electrons occupying surface traps, so that the reduction in the number of surface traps should reduce the low frequency noise voltage; this corresponds to the data that was obtained during our tests.

In addition to the application of our ion bombardment process in conjunction with dielectric layers comprising silicon dioxide/phosphosilicate glass laminates, the process may also be applied to other dielectrics such as silicon dioxide alone or silicon nitride.

Although the device described in our specific example is an N-channel depletion type field effect transistor, it should be clearly understood that the invention is also applicable to other types of insulated gate semiconductor devices. The process of our invention may be used in conjunction with the manufacture of P-channel as well as N-channel devices and of devices which operate in the enhancement mode as well as those which operate in the depletion mode.

We claim:

1. In a process for manufacturing an insulated-gate semiconductor device having spaced source and drain regions in a body of semiconductor material, said regions being interconnected by a channel region adjacent a given surface of said body, said process including the step of (1) forming a dielectric layer including silicon dioxide, silicon nitride, or phosphosilicate glass on said surface overlying at least a part of said channel region and (ii) depositing a conductive layer on said dielectric layer to provide a gate electrode, the improvement comprising reducing the temperature coefficient of gate voltage of said device to a predetermined value less than an initial value by the steps of:

exposing said dielectric layer to an ionizable gas selected from Group O of the Periodic Table;

establishing an electric field within said gas sufficient to cause ionization thereof;

accelerating ions of said gas in the vicinity of said dielectric layer so that said ions impinge upon and bombard said dielectric layer; and terminating the foregoing steps when said temperature coefficient reaches said predetermined value.

2. The improvement according to claim 1, wherein said electric field is established by a potential difference applied between electrodes exposed to said gas and spaced from said device.

3. The improvement according to claim 1, wherein said electric field is established by spaced conductive members coupled to a unidirectional voltage source.

4. The improvement according to claim 1, wherein said gas is maintained at a pressure not exceeding a value on the order of 50 microns of mercury.

5. The improvement according to claim 4, wherein said electric field is established by spaced conductive members having a potential difference on the order of 20,000 volts peak-to-peak therebetween.

References Cited

UNITED STATES PATENTS

| | | | |
|---|---|---|---|
| 3,298,863 | 1/1967 | McCusker | 29—576 X |
| 2,891,203 | 3/1954 | Thornton | 29—576 X |

OTHER REFERENCES

E. Kooi: The Surface Properties of Oxidized Silicon, Springer-Verlag N.Y., Inc. pp. 77–79, 1967.

E. Kooi: The Surface Properties of Oxidized Silicon, Springer-Verlag N.Y., Inc., p. 64.

ALFRED L. LEAVITT, Primary Examiner

W. E. BALL, Assistant Examiner

U.S. Cl. X.R.

29—576; 117—93.3; 148—1.5